(12) United States Patent
Kim et al.

(10) Patent No.: US 8,273,179 B2
(45) Date of Patent: Sep. 25, 2012

(54) DEPOSITION MASK FOR DISPLAY DEVICE AND METHOD FOR FABRICATING THE SAME

(75) Inventors: Iee-Gon Kim, Yongin (KR); Tae-Hyung Kim, Suwon (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 826 days.

(21) Appl. No.: 10/704,825

(22) Filed: Nov. 12, 2003

(65) Prior Publication Data

US 2004/0202821 A1    Oct. 14, 2004

(30) Foreign Application Priority Data

Mar. 27, 2003  (KR) .................. 10-2003-0019297

(51) Int. Cl.
C23C 16/00 (2006.01)
B05D 1/32 (2006.01)
C25D 13/00 (2006.01)
C23F 17/00 (2006.01)

(52) U.S. Cl. ........ 118/721; 118/720; 118/504; 427/468; 204/485

(58) Field of Classification Search .................. 118/720, 118/721, 504, 505; 427/468; 204/485; 438/551–555

See application file for complete search history.

(56) References Cited

U.S. PATENT DOCUMENTS

| | | | | |
|---|---|---|---|---|
| 4,915,057 | A * | 4/1990 | Boudreau et al. | 118/505 |
| 6,146,489 | A * | 11/2000 | Wirth | 156/280 |
| 6,258,495 | B1 * | 7/2001 | Okamura et al. | 430/22 |
| 6,475,287 | B1 | 11/2002 | Clark | |
| 6,589,382 | B2 * | 7/2003 | Clark et al. | 156/304.3 |
| 6,858,086 | B2 * | 2/2005 | Kang | 118/720 |
| 6,866,720 | B2 * | 3/2005 | Kim et al. | 118/504 |
| 6,878,208 | B2 * | 4/2005 | Abiko | 118/720 |
| 6,893,709 | B2 * | 5/2005 | Kitazume | 428/192 |
| 2002/0102754 | A1 * | 8/2002 | Fujimori et al. | 438/22 |
| 2003/0101932 | A1 * | 6/2003 | Kang | 118/504 |
| 2003/0108805 | A1 * | 6/2003 | Clark | 430/22 |

FOREIGN PATENT DOCUMENTS

| | | |
|---|---|---|
| JP | 62-198863 | 9/1987 |
| JP | 2002-075842 | 3/2002 |

* cited by examiner

*Primary Examiner* — Rakesh Dhingra
(74) *Attorney, Agent, or Firm* — H.C. Park & Associates, PLC

(57) ABSTRACT

A deposition mask for depositing a thin film and a method for fabricating the same are disclosed. The deposition mask is configured to ensure a positioning accuracy and a pattern size accuracy and is suitable for use in manufacturing a high definition display device. The deposition mask includes at least one pattern mask having the same patterns as the patterns that are to be formed on a substrate and a frame mask which has at least one opening. The pattern mask is individually and non-detachably fixed to the frame mask at a region of the frame mask corresponding to the opening.

6 Claims, 8 Drawing Sheets

DEPOSITION MASK FOR DISPLAY DEVICE AND METHOD FOR FABRICATING THE SAME

CROSS REFERENCE TO RELATED APPLICATION

This U.S. nonprovisional patent application claims priority under 35 U.S.C. §119 of Korean Patent Application 2003-19297 filed on Mar. 27, 2003, the entire contents of which is hereby incorporated by reference.

BACKGROUND OF THE INVENTION

1. Field of the Invention

The invention relates to a mask for depositing a thin film used for a flat panel display and, more particularly, a deposition mask and a method for fabricating the same suitable for a flat panel display with high definition and with an improved positioning accuracy and pattern size accuracy.

2. Description of the Related Art

A deposition mask for use in depositing a thin film of a display device is typically fabricated with an etching method applying a photolithography and an electroforming method applying the photolithography and an electrolysis method. The fabricated deposition mask is finely aligned with a substrate where a deposition target, that is, the display device is to be formed. A deposition source is supplied through the deposition mask, thereby depositing a desired pattern onto the substrate. Such a deposition mask is basically a fine patterned mask, and becomes difficult to fabricate depending on a size of the mask and a high definition of the display.

Generally, for a deposition mask, the thinner a metal thin film used for the deposition process, is the higher the grade of the display device becomes after a deposition process. Thus, which results that the thinner the metal thin film of the deposition mask is the better. However, if the metal thin film is thin, the deposition mask can be damaged during the deposition process or a deposition-preparation process, even though a positioning accuracy and a pattern size accuracy are ensured.

Therefore, the conventional deposition mask is fabricated in a size applicable to a thin film deposition apparatus, in which not only the positioning accuracy and the pattern size accuracy of the deposition mask but also a mask alignment for determining the location and a mechanical processing for contact play important roles in determining the grade of the display device fabricated on a glass substrate. Preferably, this deposition mask is simple to fabricate, takes less time to make, and is low cost.

FIGS. 1A, 1C and 1D illustrate plan views of a conventional deposition mask used for depositing the thin film of a display device. FIG. 1B illustrates a cross sectional view of the conventional deposition mask used for depositing the thin film of a display device, taken along line IB-IB of FIG. 1A. The deposition mask shown in FIGS. 1A to 1D is used for fabricating a number of display devices on a substrate and thus, is used in cases where the display device is smaller than the deposition target, that is, the substrate.

Referring to FIGS. 1A and 1B, a conventional deposition mask 100 comprises a frame 120 and a fine patterned mask 110 supported by the frame 120. As shown in FIG. 1C, the frame 120 comprises an opening 125 at a center except an edge 121, and supports the fine patterned mask 110. The fine patterned mask 110 includes a plurality of pattern masks 112 having the patterns to be formed on the substrate, as shown in FIG. 1D. In the fine patterned mask 110, the plurality of pattern masks 112 are arranged corresponding to the opening 125 of the frame 120. A reference numeral 116 indicates an edge of the fine patterned mask 110, while reference numerals 117 and 118 indicate parts between the pattern masks 112 of the fine patterned mask 110.

Each of the plurality of pattern masks 112 corresponds to a substrate, e.g., the display device to be formed on a dielectric substrate, and includes opening 114 having the same patterns as are to be formed on the substrate.

The method for fabricating the conventional deposition mask having the above structure will be explained as follows. First, the fine patterned mask 110 is made as one-body type that includes the plurality of pattern masks 112 by means of conventional methods, such as the photolithography method or the electroforming method. The fine patterned mask 110 is aligned to correspond to the opening 125 of the frame 120, and then the fine patterned mask 110 is fixed to the frame 120 with a welding or an adhesion.

FIGS. 2A and 2B illustrate a plan view and a cross sectional view of a conventional deposition mask for use in depositing the thin film of the display device, of which FIG. 2B illustrates a cross sectional view taken along line IIB-IIB of FIG. 2A. The deposition mask shown in FIGS. 2A and 2B is used for fabricating one display device on a substrate, which is used where the display device has a similar size as the deposition target, that is, the substrate.

Referring to FIGS. 2A and 2B, the conventional deposition mask 200 comprises a frame and a fine patterned mask 210. As shown in FIG. 2B, the frame 220 includes an opening 225 at a center except an edge 221. The fine patterned mask 210 includes one pattern mask 212 having a similar size as the deposition target, that is, the substrate. The pattern mask 212 in the fine patterned mask 210 includes an opening 214 having the same patterns as those of the display device to be formed on the substrate and edges 216.

Similarly, in the conventional deposition mask 200, the fine patterned mask 210 is fabricated as one-body type by means of conventional methods, such as the photolithography method or the electroforming method. The fine patterned mask 210 is aligned to correspond to the opening 225 of the frame 220 and then the fine patterned mask 210 is fixed to the frame 220 with the welding or the adhesion.

As described above, the conventional deposition mask used for depositing the thin film of the display device at least has the following problems.

As the fine patterned mask is fabricated in one-body type, by forming the pattern mask on the metal thin film with the etching process using the photolithography, or the electroforming method using the photolithography or the electrolysis, it is very difficult to fabricate the large-sized fine mask without a defect, such as a pattern failure, and the pattern size accuracy is degraded. Additionally, it is difficult to align and fix the fine mask to the frame, as well as to achieve a desired positioning accuracy due to the pattern mask formed as one-body type.

SUMMARY OF THE INVENTION

The invention provides a deposition mask and a method for fabricating the same, capable of improving a positioning accuracy and a pattern size accuracy.

The invention separately provides a deposition mask and a method for fabricating the same, which is easy to fabricate and is suitable for a high definition display device.

The invention separately provides a deposition mask comprising, at least one pattern mask having the same patterns as are to be formed on a substrate and a frame mask having at least one opening, where the pattern mask is individually fixed to the frame mask corresponding to the opening.

In various embodiments of the invention, the deposition mask further comprises a frame for supporting the frame mask, and the frame mask is made of magnetic metals, while the frame and the pattern mask are made of metals, metal alloys, or polymer resins.

The invention separately provides a method for fabricating a deposition mask comprising the steps of preparing at least one pattern mask having the same patterns as are formed on a substrate and a frame mask having at least one opening aligning the pattern mask to the opening of the frame mask and fixing the pattern mask aligned with the opening to the frame mask.

In various embodiments of the invention, by repeating the aligning and the fixing steps, pattern masks are fixed individually to each opening of the frame mask. The method further comprises the step of fixing the frame mask to a frame after preparing the pattern mask and the frame mask. The steps of fixing the pattern mask to the frame mask and fixing the frame mask to the frame are performed by using a welding or an adhesion. The pattern mask is fabricated with an etching method such as photolithography, or an electroforming method using the photolithography or an electrolysis method.

The invention separately provides a flat panel display. The flat panel display is fabricated with a deposition mask where at least one pattern mask having the same patterns as are formed on a substrate is aligned and individually fixed to at least one opening of a frame mask.

DETAILED DESCRIPTION OF THE EXEMPLARY EMBODIMENT

Exemplary embodiments of the invention will now be described as follows with reference to the accompanying drawings.

Figure 1A:
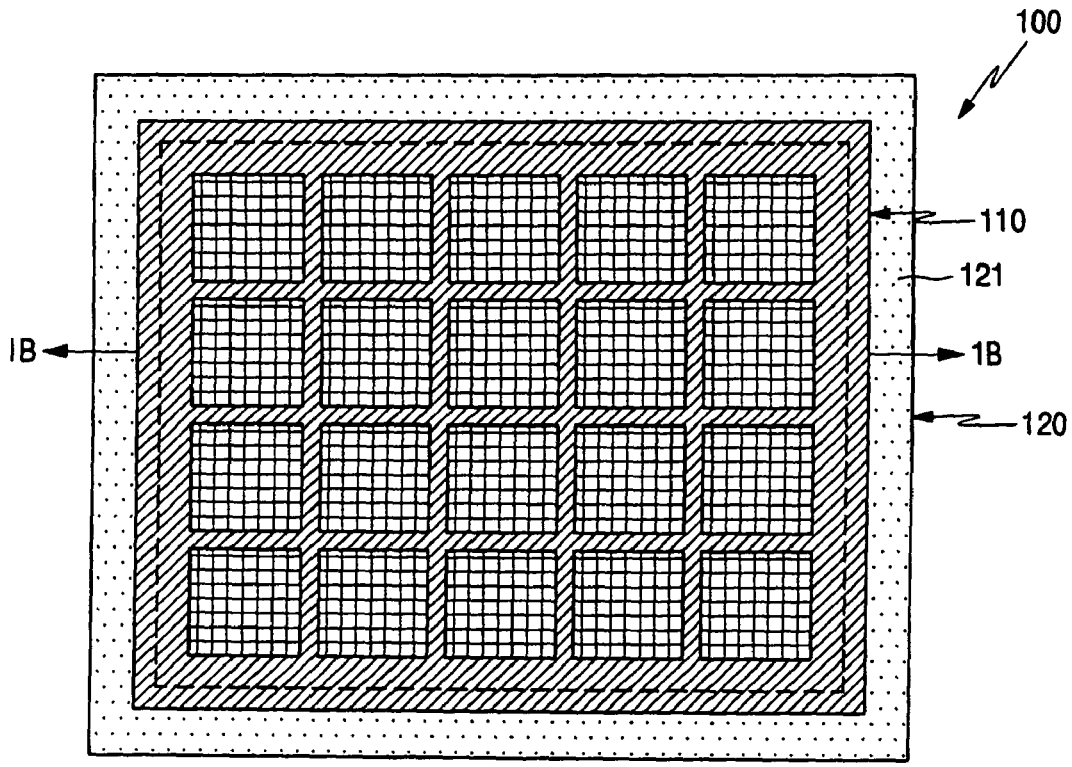
FIGS. 1A, 1C and 1D are plan views of a conventional deposition mask for a display device used where a deposition target is smaller than a substrate of a display device.
Figure 1B:
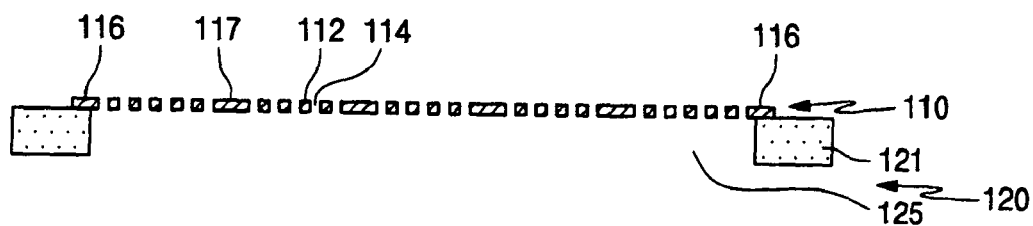
FIG. 1B is a cross sectional view of a conventional deposition mask for a display device used where a deposition target is smaller than a substrate of a display device.
Figure 1C:
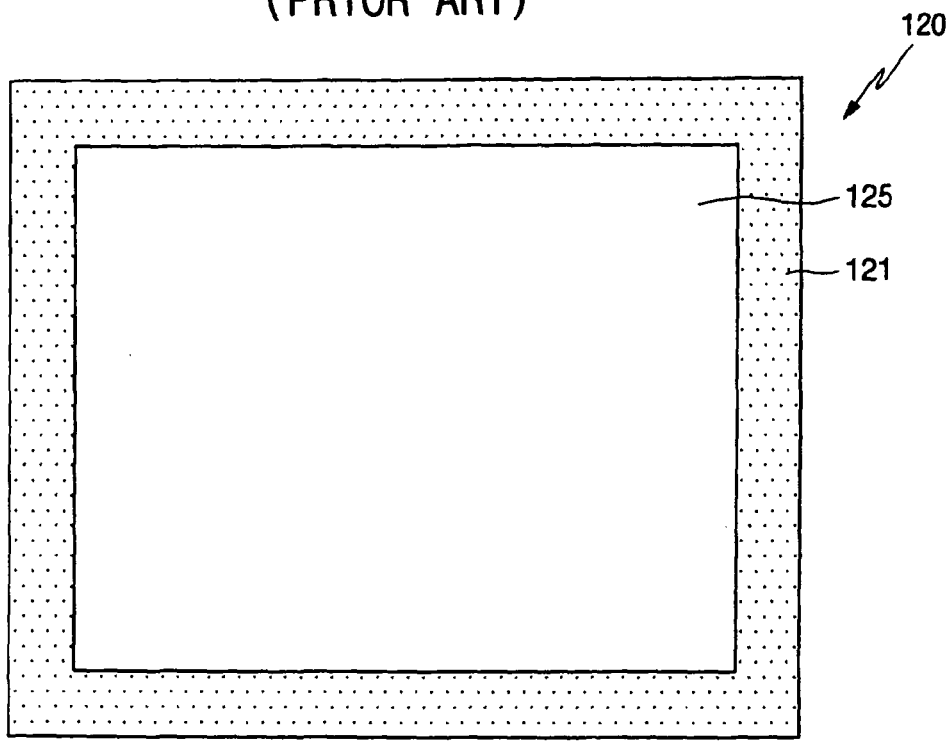
Figure 1D:
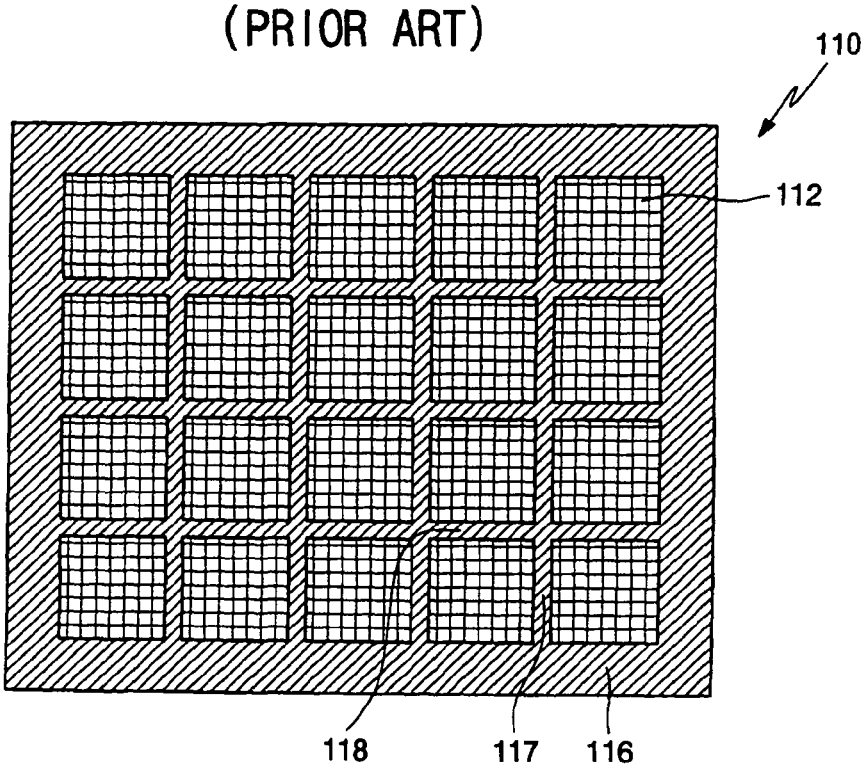
Figure 2A:
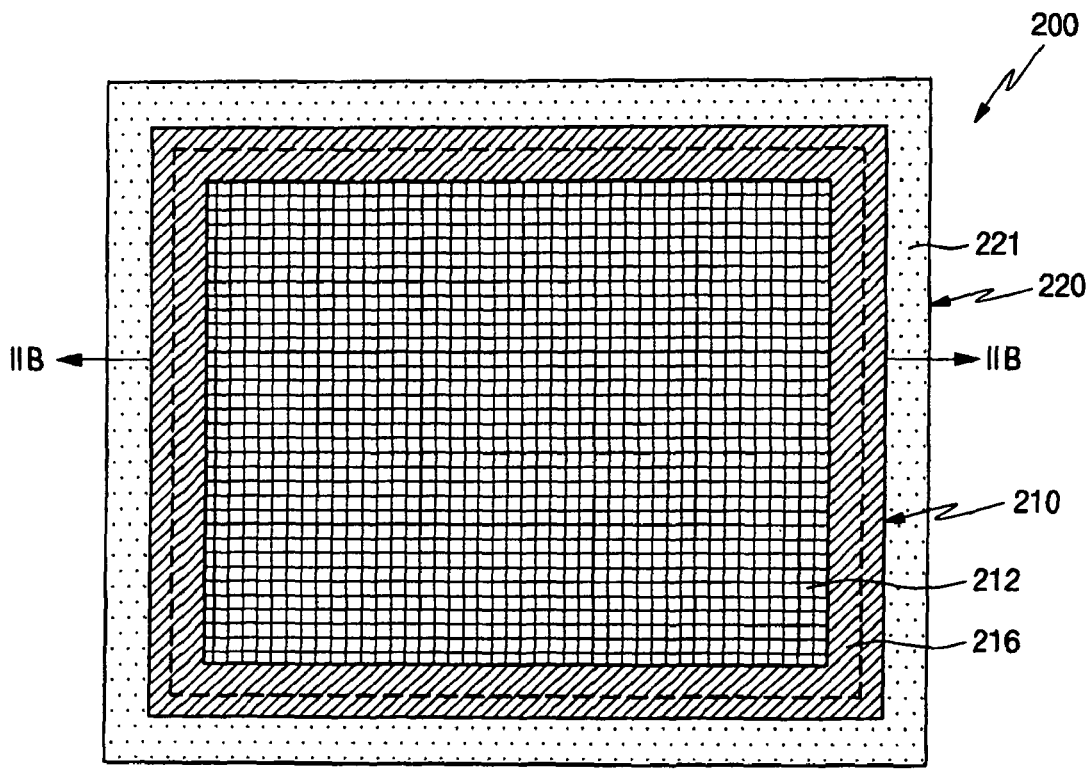
FIGS. 2A and 2B are a plan view and a cross sectional view, respectively, of a conventional deposition mask for a display device used where a deposition target has a similar size as a substrate of a display device.
Figure 2B:
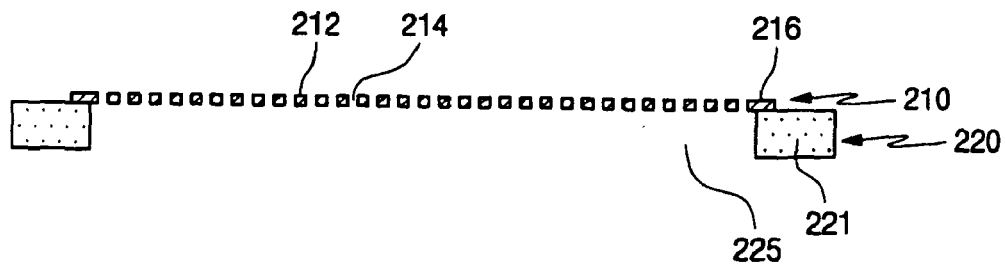
Figure 3A:
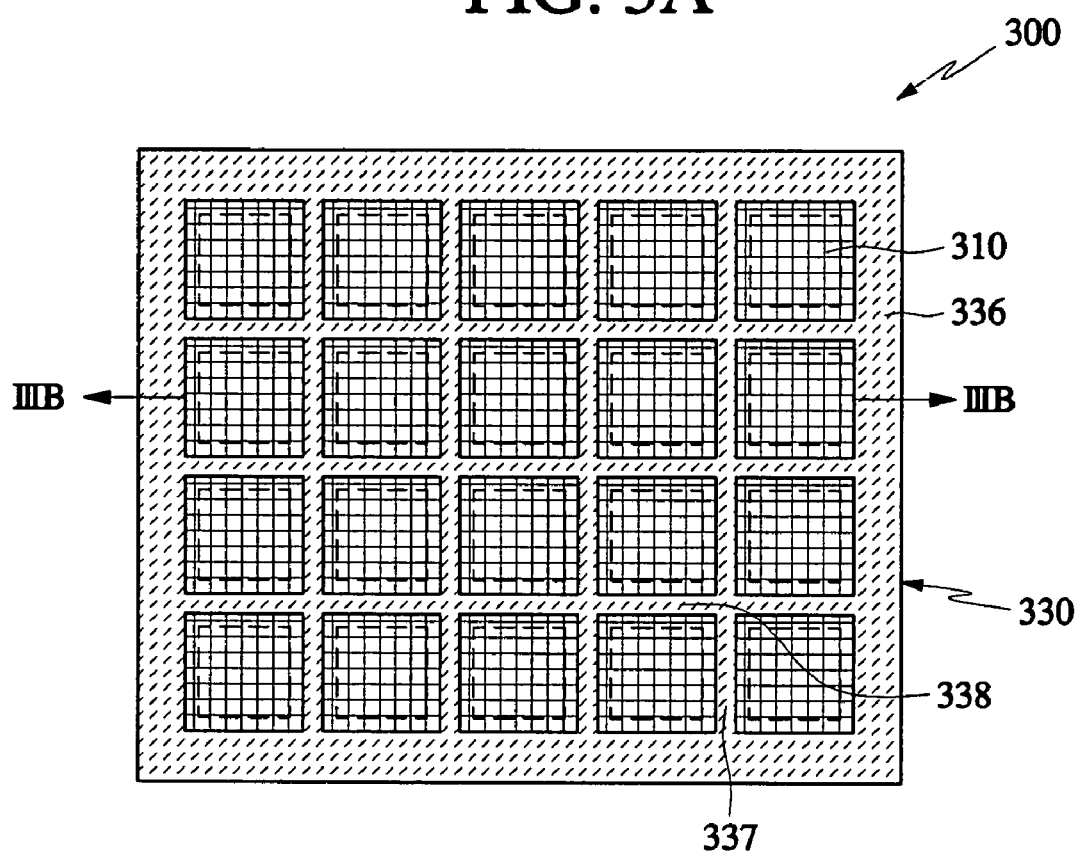
FIGS. 3A and 3C are plan views of a deposition mask used for a display device according to an embodiment of the invention.
Figure 3B:
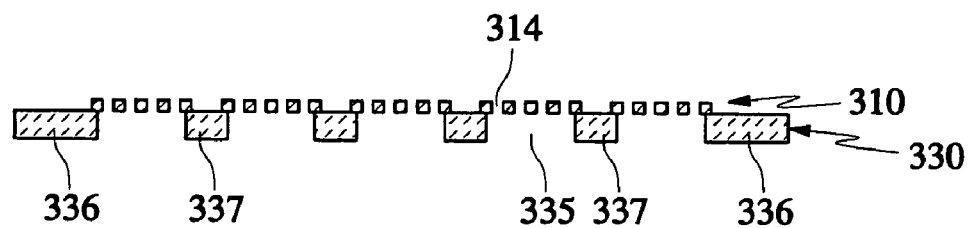
FIG. 3B is a cross sectional view of a deposition mask used for a display device according to an embodiment of the invention.
Figure 3C:
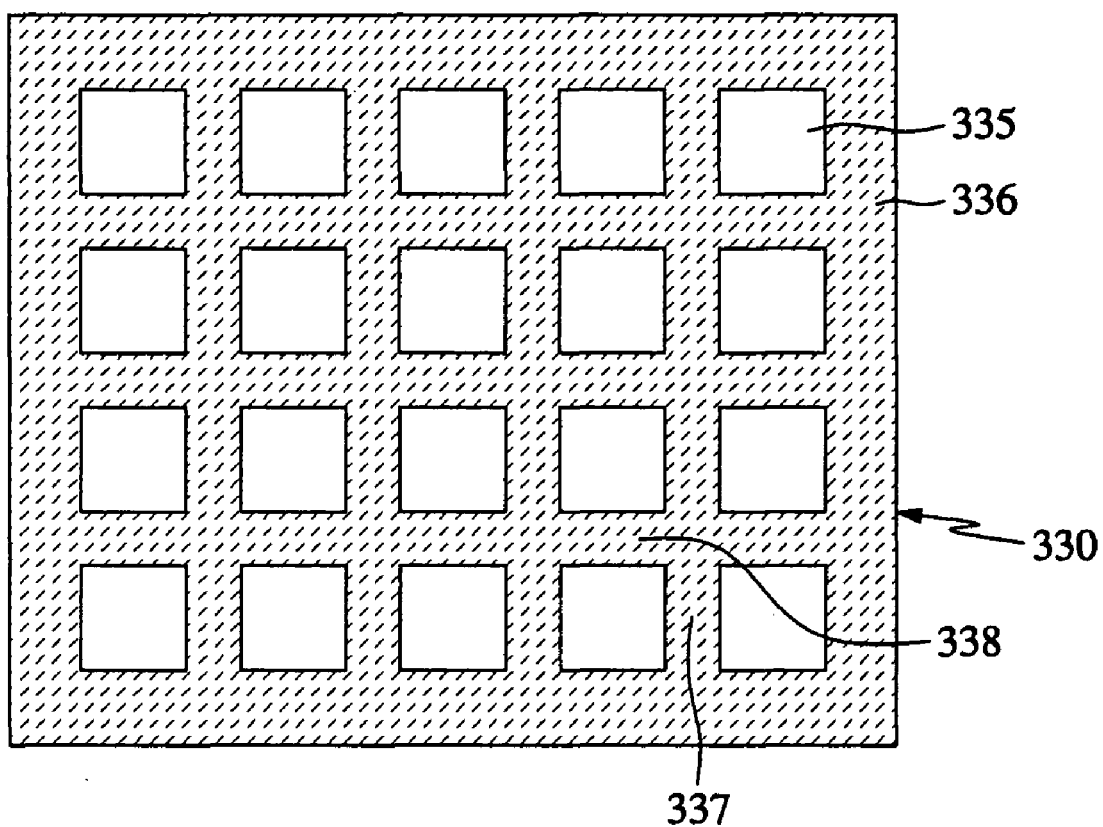

FIGS. 3A and 3C are plan views of a mask for depositing a thin film used for a flat panel display according to an exemplary embodiment of the invention. FIG. 3B is a cross sectional view of a mask for depositing a thin film used for a flat panel display according to an exemplary embodiment of the invention, taken along line IIIB-IIIB of FIG. 3A. A deposition mask 300 according to an exemplary embodiment of the invention is used for fabricating a number of display devices on one substrate, which is used where the display device is smaller than a deposition target, that is, a substrate.

The deposition mask 300 of the invention comprises a frame mask 330 and a plurality of pattern masks 310 of fine patterns which are fixed to the frame mask 330. The frame mask 330 acts as a supporting body to the pattern masks 310. The frame mask 330 includes a plurality of openings 335 corresponding to positions where the pattern masks 310 are to be fixed, and a frame part for supporting the pattern mask 330 of fine pattern, as illustrated in FIG. 3C.

The openings 335 of the frame mask 330 are for ensuring an effective area of the deposition target, that is, the substrate. Further, the openings 335 have a size which corresponds with the size to the pattern mask 310 of fine pattern, that is, a display device to be formed on a substrate. The frame part of the frame mask 330 consists of an edge portion 336 enclosing the number of openings 335, and the portions 337 and 338 intersect each other and establish the shape of the openings 335.

The plurality of pattern masks 310 are arranged with the openings 335 of the frame mask 330 one by one and are individually fixed to the openings 335. Each pattern mask 310 includes openings 314 that have the same patterns as the patterns that are to be formed on the substrate.

Figure 5:
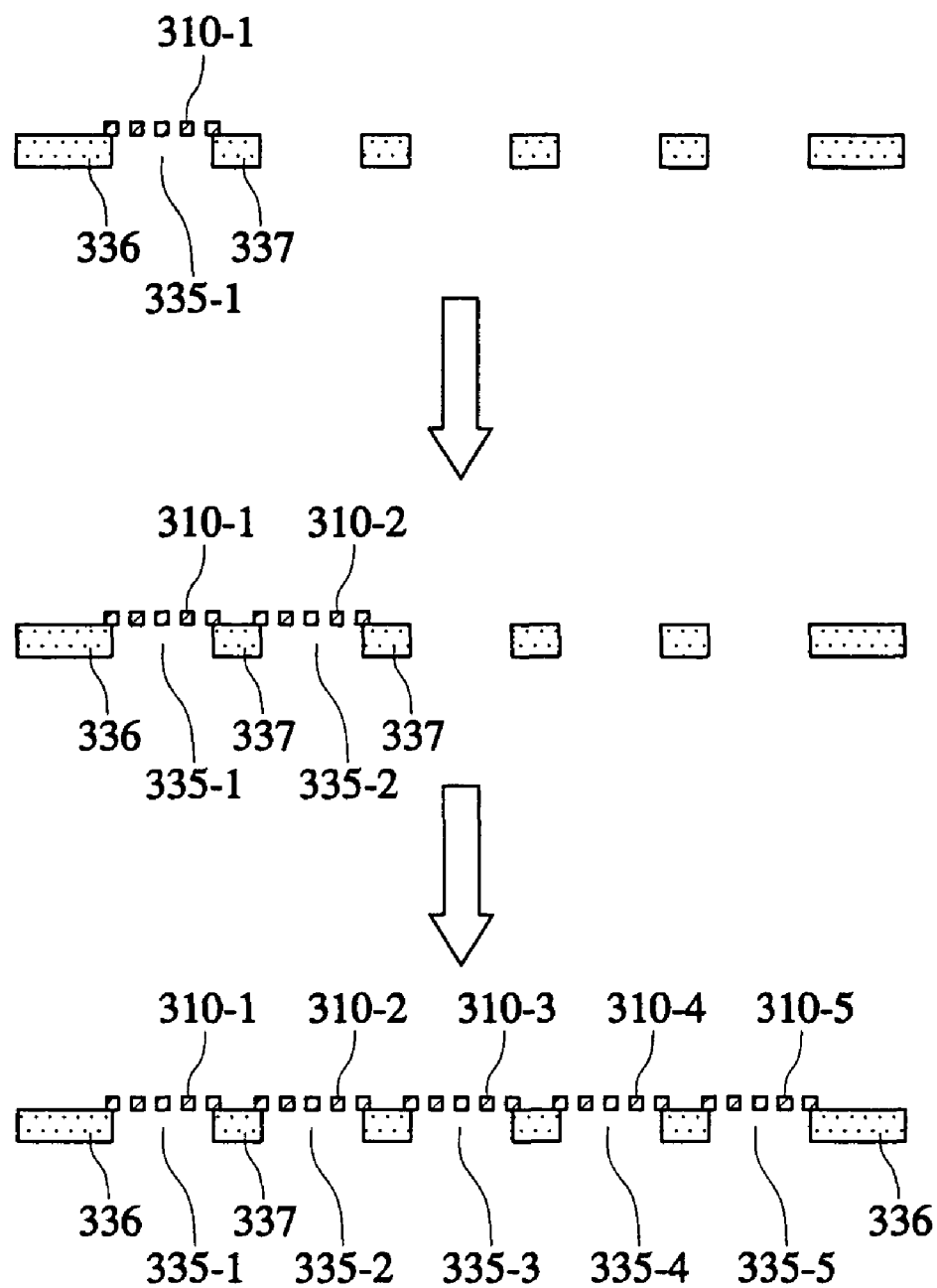
FIGS. 5 and 6 are flow charts illustrating a method for fabricating a deposition mask for use in a display device according to an embodiment of the invention.
Figure 6:
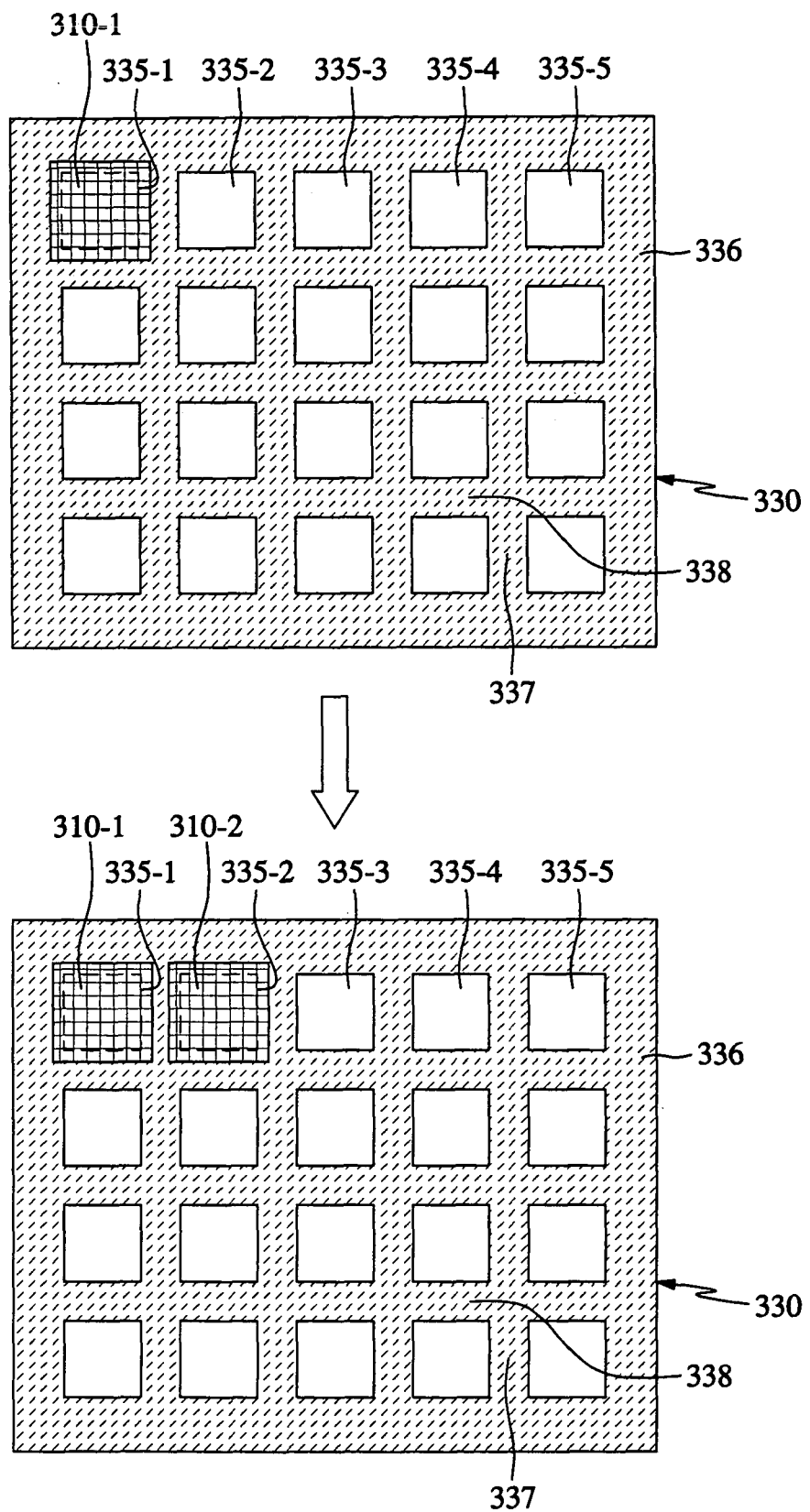

A method for fabricating the deposition mask 300 having the above structure according to the invention will be described with reference to FIGS. 5 and 6.

First, a plurality of the pattern mask 310 of fine pattern and a frame mask 320 including a number of openings 335 are fabricated, respectively. The pattern masks 310 are fabricated with an etching method using a typical photolithography process, or an electroforming method using the photolithography process and an electrolysis method, and a cutting method by direct illumination of laser. The pattern mask 310 includes openings 314 that have the same patterns as the pattern of the display device to be formed on the substrate.

Subsequently, a number of the pattern masks 310 are aligned to the number of openings 335 of the frame mask 330 one by one, and are individually fixed by welding or an adhesive. That is, as illustrated in FIGS. 5 and 6, a pattern mask 310-1 is aligned and fixed to corresponding opening 335-1 of the plurality of openings 335-1 to 335-5 of the frame mask 330. Then a pattern mask 310-2 is aligned and fixed to an opening 335-2. By repeating such operations, the number of pattern masks 310 are individually aligned and fixed to the number of openings 335 respectively, thereby fabricating the deposition mask 300 as shown in FIG. 3A according to an exemplary embodiment of the present invention.

Herein, a method for ensuring the positioning accuracy between the pattern masks 310 and the openings 335 of the frame mask 330 involves, forming an alignment mark (not shown), based on which the alignment accuracy between the pattern mask 310 and the frame mask 330 can be checked. The alignment mark may be formed on predetermined positions of the pattern masks 310 and the frame mask 330 and make it possible to check the alignment between the pattern mask 310 and the frame mask 330 with a vision system (not shown) having a camera. Then, if the checking result indicates that the positioning accuracy is within a permissible range the pattern mask 310 is fixed to the frame mask 330.

Therefore, in an exemplary embodiment of the invention, the deposition mask is not fabricated by fabricating a plurality of pattern masks in one-body type, but by individually fabricating a plurality of pattern masks and by individually aligning and fixing the individually fabricated pattern masks to the openings of the frame mask respectively. Thus, the positioning accuracy and the pattern size accuracy are improved. In addition, mask size is reduced facilitating mask fabrication and reducing a manufacturing cost.

Figure 4A:
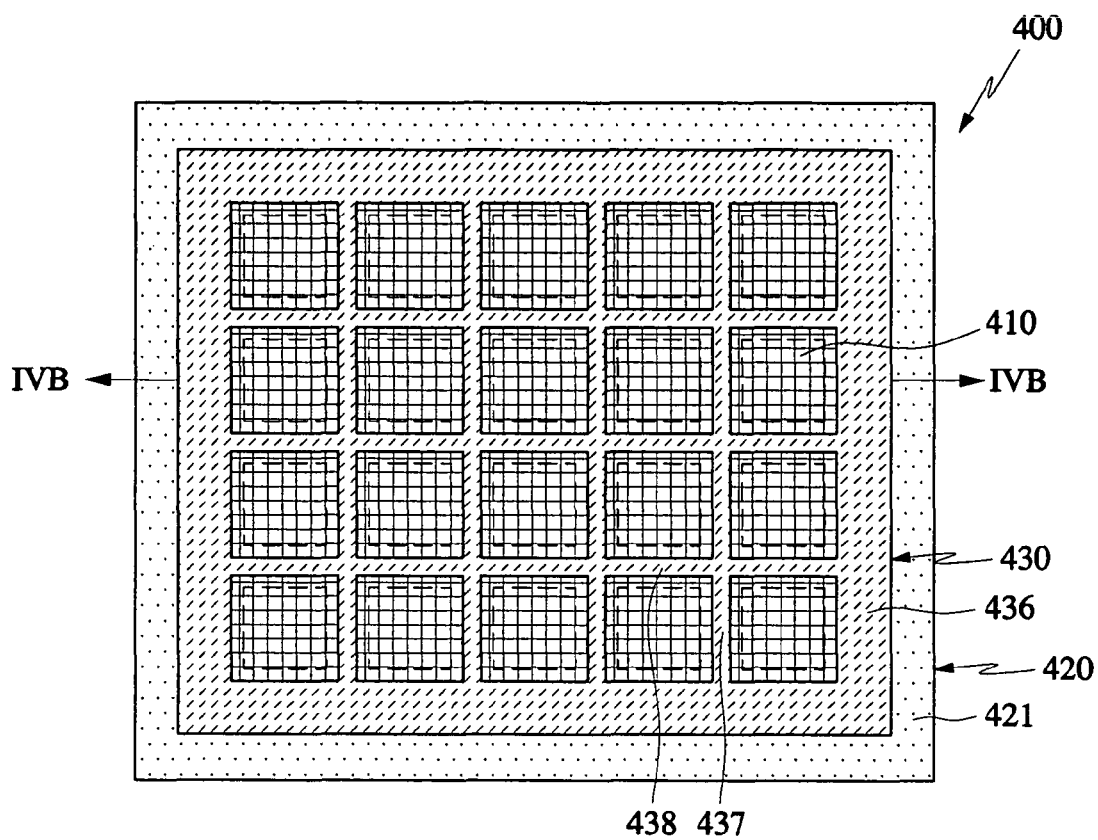
FIGS. 4A and 4B are a plan view and a cross sectional view, respectively, of a deposition mask used for a display device according to another exemplary embodiment of the invention.
Figure 4B:
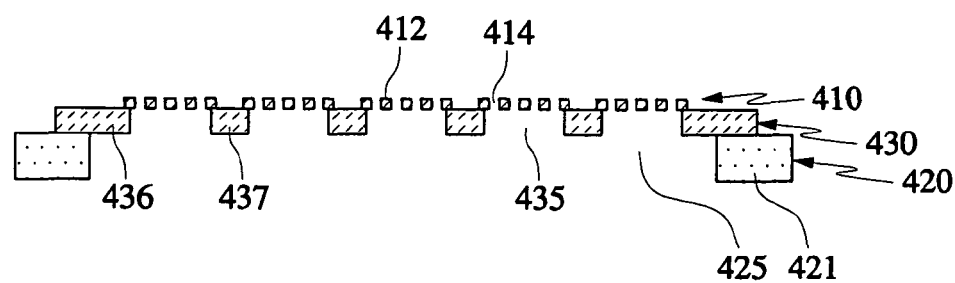

FIGS. 4A and 4B are a plan view and a cross sectional view of masks for depositing a thin film used for a flat panel display according to another exemplary embodiment of the invention. FIG. 4B is a cross sectional view taken along line IVB-IVB of FIG. 4A. A deposition mask 400 according to another embodiment of the invention is for fabricating a plurality of display devices on one substrate, which is used where the display device is smaller than the deposition target, that is, the substrate.

The deposition mask 400 according to another exemplary embodiment of the invention includes a frame mask 430 supported with a frame 420 in order to more strongly support the pattern masks 410. Reference numerals 437 and 438 indicate parts between the pattern masks 410. The frame mask 430 includes openings 435 corresponding to the pattern masks 410 and edges 436. Since the frame 420 acts a supporting body to the frame mask 430, it may have a structure that has an opening 425 at a center of the frame and an edge 412, as illustrated in FIG. 4B. By having the additional support of the frame 420, the structure can guarantee support for a large effective area of a substrate. A thin film may be deposited on the substrate using the pattern masks 410.

In the exemplary embodiments of the invention, the frame and the pattern masks are made of pure metals, metal alloys, or polymer resins, etc. The frame mask is made of magnetic metals that have a good adhesion between the frame and the pattern masks and strength enough to prevent warping.

Although the exemplary embodiments of the invention are described only for the deposition mask used where a number of display devices are fabricated on one substrate, they are also applicable to a variety of deposition masks including a deposition mask for fabricating one display device on one substrate.

According to the exemplary embodiments of the invention as described above, contrary to the conventional deposition mask where the fine patterned mask is fabricated in one-body type, the pattern masks are individually fabricated, and aligned and fixed to frame masks respectively, thereby improving the positioning accuracy and the pattern size accuracy, and facilitating the process. Moreover, the deposition mask appropriate for the high definition display can also be provided.

Although the exemplary embodiments of the invention are described above, it will be appreciated by those of ordinary skill in the art that various changes and modifications may be made with departing from the spirit and scope of the invention as described in the following claims.

What is claimed is:

1. A deposition mask, comprising:
   a plurality of pattern masks, each pattern mask comprising a plurality of openings and having same patterns as patterns that are to be formed on a substrate; and
   a unibody frame mask having a plurality of openings defined by intersecting vertical and horizontal members,
   wherein each pattern mask is individually and permanently fixed to the frame mask such that each pattern mask is respectively exposed via an opening of the unibody frame mask and each pattern mask contacts the unibody frame mask.

2. The deposition mask of claim 1, further comprising:
   a frame for supporting the frame mask.

3. The deposition mask of claim 2, wherein the frame mask is made of magnetic metals.

4. The deposition mask of claim 2, wherein the frame and the pattern mask are made of at least one of a metal, metal alloy, and a polymer resin.

5. The deposition mask of claim 1, wherein the frame mask includes a plurality of first alignment marks and each pattern mask includes a second alignment mark corresponding to a first alignment mark of the frame mask, the first alignment marks and the second alignment marks being in alignment with each other.

6. The deposition mask of claim 5, wherein the first alignment marks and the second alignment marks are recognizable to a vision system comprising a camera.

* * * * *